United States Patent [19]

Seki

[11] Patent Number: 4,914,047

[45] Date of Patent: Apr. 3, 1990

[54] METHOD OF PRODUCING INSULATED GATE MOSFET EMPLOYING POLYSILICON MASK

[75] Inventor: Yasukazu Seki, Kanagawa, Japan

[73] Assignee: Fuji Electric Co., Ltd., Kawasaki, Japan

[21] Appl. No.: 316,474

[22] Filed: Feb. 27, 1989

[30] Foreign Application Priority Data

Mar. 3, 1987 [JP] Japan .................................. 63-50513

[51] Int. Cl.$^4$ .......................................... H01L 21/265
[52] U.S. Cl. ........................................ 437/29; 437/41;
437/44; 437/148; 437/150; 148/DIG. 126
[58] Field of Search ...................... 437/27, 28, 29, 40,
437/41, 44, 45, 147, 148, 149, 150, 153, 158,
984; 359/23.4

[56] References Cited

U.S. PATENT DOCUMENTS

| | | | |
|---|---|---|---|
| 4,443,931 | 4/1984 | Baliga et al. | 437/203 |
| 4,680,604 | 7/1987 | Nakagawa et al. | 357/23.4 |
| 4,680,853 | 7/1987 | Lidow et al. | 437/41 |
| 4,774,198 | 9/1988 | Contiero et al. | 437/30 |
| 4,810,665 | 3/1989 | Chang et al. | 437/41 |

FOREIGN PATENT DOCUMENTS

| | | | |
|---|---|---|---|
| 0003973 | 1/1984 | Japan | 437/41 |
| 0266871 | 11/1987 | Japan | 357/23.4 |

*Primary Examiner*—Brian E. Hearn
*Assistant Examiner*—T. N. Quach
*Attorney, Agent, or Firm*—Brumbaugh, Graves, Donohue & Raymond

[57] ABSTRACT

The present invention relates to a method of producing a vertical insulated gate field effect transistor. In the present invention a window portion is formed on a polysilicon layer which serves as a gate, by selectively etching the layer so as to leave the central portion intact. Ions of impurities are implanted while using the polysilicon layer having the window portion as a mask. Thereby a phase layer is formed and the ions of impurities are again implanted from the window portion, forming the N+ source region. Since this method is different from a conventional method in that positioning using a special resist mask is unnecessary, the N+ source region is formed by self alignment with a high efficiency and a high accuracy without any positional deviation caused by inaccurate positioning of a mask.

8 Claims, 4 Drawing Sheets

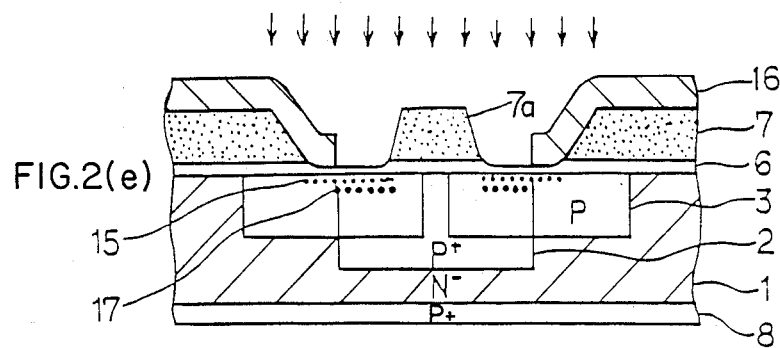
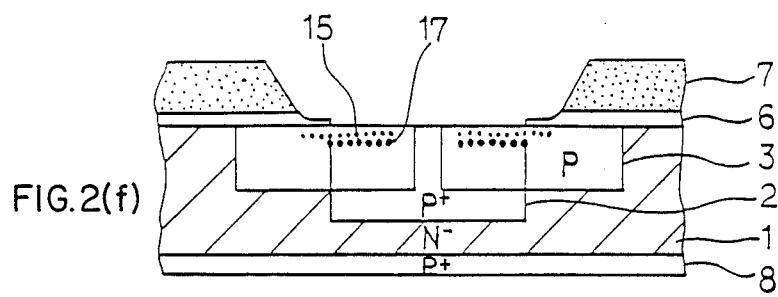
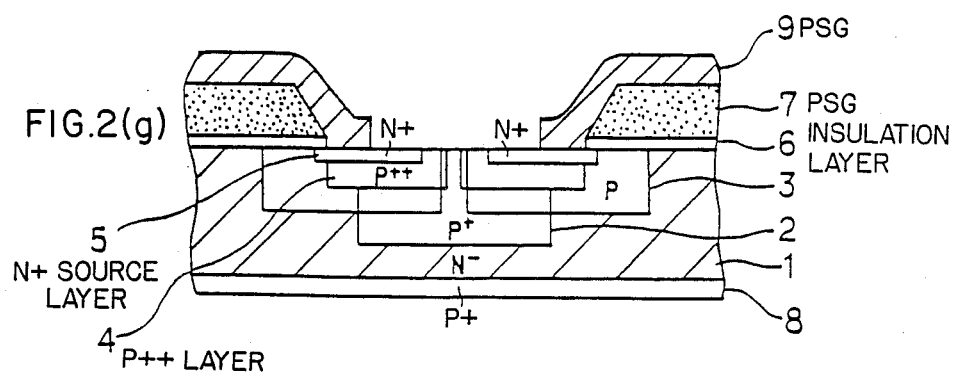

METHOD OF PRODUCING INSULATED GATE MOSFET EMPLOYING POLYSILICON MASK

BACKGROUND OF THE INVENTION

The present invention relates to a method of producing an insulated gate bipolar transistor ("IGBT") or a vertical insulated gate field effect transistor.

Of the insulated gate field effect transistors, insulated gate bipolar transistors and power MOSFETs have substantially the same fundamental element structure in spite of a difference in detailed dimensions. The two MOSFETs are distinguished from each other depending upon whether they have on the drain side a region of an opposite conductivity type to that of the source. Therefore, IGBTs are mainly described in this specification but the same is applicable to power MOSFETs.

FIG. 3 is a sectional view showing the structure of an IGBT having an N-type channel element. Fundamentally, an IGBT has a four-layer construction of PNPN, although NPNP types can also be made. Such an IGBT includes a high-resistance N⁻ layer 1, a P+ region 2, a P-type base region 3, a high-impurity- density P++ region 4, an N+ source region 5, a gate oxide film 6, a polysilicon gate 7, a P+ layer 8, a PSG insulation layer 9, a source electrode 10, a gate electrode 11, and a drain electrode 12. The symbols S, G and D represent the terminals of a source, a gate and a drain, respectively. The P+ layer 8 exists in an IGBT but does not exist in a power MOSFET.

In the region directly under the source electrode of an IGBT or a power MOSFET, it is necessary to short-circuit the N+ source region 5 and the P+ region 2, as shown in FIG. 3. Various processes are adopted for producing the short-circuited portion.

FIG. 4 shows an example of these processes for an IGBT. The same numerals are provided for the elements which are the same as those in FIG. 3. In FIG. 4, the well known initial steps are omitted. The surface of a semiconductor substrate consisting of the N⁻ layer 1 formed on the P+ layer 8 by epitaxial growth is first subjected to initial oxidization. The semiconductor substrate is photoetched so as to form a window portion at a predetermined portion thereof and boron ions are implanted through the window portion. By thermal diffusion, the P+ region 2 is formed embedded in the N⁻ layer 1. The gate oxide film 6 is next formed and the polysilicon layer 7 which is to serve as a gate is formed thereon. FIG. 4(a) shows the polysilicon layer 7 immediately after being photoetched so as to have a window portion. Generally, boron ions are implanted again while using the etched polysilicon layer 7 as a mask, and the P-type base region 3 is formed by high-temperature driving. A resist is applied to the P-type base region 3, which is photolithographed using a photomask so as to leave a resist 13 at the central portion. In order to form the N+ source region 5, arsenic is implanted while using the resist 13 as a mask. This state is shown in FIG. 4(b). Implantation of arsenic ions is indicated with the arrows and the implanted ions are represented by the numeral 14. At the step shown in FIG. 4(c), the resist 13 is removed and an appropriate high-temperature treatment is applied to form the N+ source region 5. Thereafter, the PSG insulation layer 9 is formed, the central part of which is photoetched so as to allow a conductive metal to be deposited thereon, thereby forming the source electrode 10.

The above-described process for short-circuiting the N+ source region 5 and the P+ region 2 is adopted in a conventional IGBT or power MOSFET. In FIG. 4, the step for forming the P++ region 4 is omitted.

The process for producing an IGBT or a power MOSFET having the above-described structure, however, has the following two problems to be solved. One is that the ion implantation for forming the N+ source region 5 using a resist mask involves a risk of poor accuracy of the position of the N+ source region 5 due to inaccurate positioning of the mask. The other is that since the process requires one additional photomask, increase in the number of steps in photoetching is unavoidable.

Accordingly, it is an object of the present invention to eliminate the above-described problems in the prior art and to provide a method of producing a vertical insulated gate MOSFET having a shorted structure between an N+ source region and a P+ region by forming the N+ source region with high accuracy by self alignment without using any special mask in place of a conventional method of forming the N+ source by using a resist mask.

SUMMARY OF THE INVENTION

To overcome this problem, the present invention forms an electrical device in accordance with the following steps:

(a) sequentially forming a semiconductor layer of a first conductivity type, a semi-conductor well region of a second conductivity type, different from said first conductivity type embedded within and forming a part of a first surface of said semiconductor layer, a gate oxide layer disposed on said first surface of the semiconductor layer of the first conductivity type, and a polycrystalline semiconductor layer;

(b) selectively etching said polycrystalline semiconductor layer so as to leave a central part and peripheral portions thereof intact and to form a window region between said central part and said peripheral portions, said window extending over portions of the semiconductor layer of the first conductivity type and the semiconductor region of the second conductivity type;

(c) introducing impurities through the window region and treating at high temperature to diffuse the impurities such that a base region of the second conductivity type is formed within the portions of the semiconductor layer of the first conductivity type and the semiconductor region of the second conductivity type which are aligned with the window;

(d) introducing further impurities through the window suitable for forming a region of the first conductivity type;

(e) forming a resist mask over the peripheral portions of the polycrystalline semiconductor layer which extends to cover a portion of the window such that a second smaller window is formed between the central part of the polycrystalline semiconductor layer and the resist mask;

(f) introducing impurities through the second smaller window suitable for forming the high impurity density region of the second conductivity type;

(g) removing the resist mask, the central part of the polysilicon layer and a central portion of the gate oxide layer; and (h) thermally diffusing the impurities introduced in steps (d) and (f) to form a source region and a high impurity region.

BRIEF DESCRIPTION OF THE DRAWINGS

FIGS. 1 and 2 show the main steps of producing an IGBT using a method according to the present invention;

For convenience of reference, like components, structural elements and features in the various figures are designated by the same reference numerals or characters.

DETAILED DESCRIPTION OF THE INVENTION

As described above, in an IGBT or a power MOSFET, the N+ layer is formed over the P+ well and a resist mask to define the boundaries of the N+ layer. In the present invention, however, the N+ layer is formed without the use of such a mask by forming a window in the polycrystalline semiconductor layer by selectively etching the layer so as to leave a central portion and peripheral portions, and implanting impurities through the window while using the polysilicon layer as a mask, thereby forming a P-type base layer. The same window is then used again during implanting of impurities to form the N+ layer. This method is different from a conventional method in that positioning using a special resist mask is unnecessary. The N+ source layer is formed by self alignment with a high efficiency and a high accuracy without any positional deviation caused by inaccurate positioning of a mask.

The present invention will be further explained with reference to the formation of a nonlimiting embodiment.

Figure 4A:
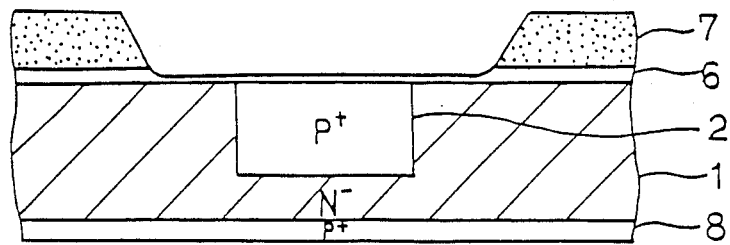
FIG. 4 shows the main steps of a conventional method for forming a source layer.
Figure 4B:
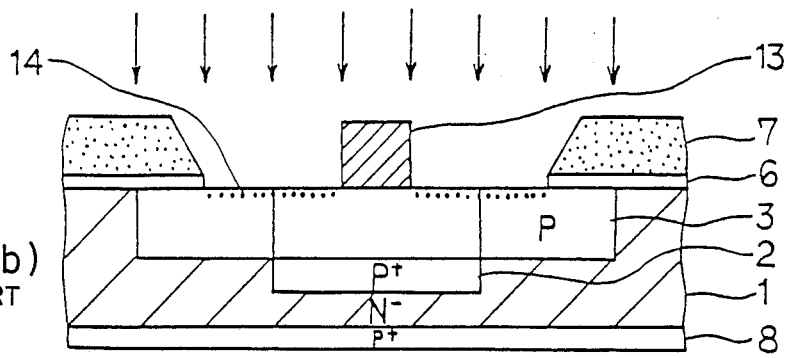
Figure 4C:
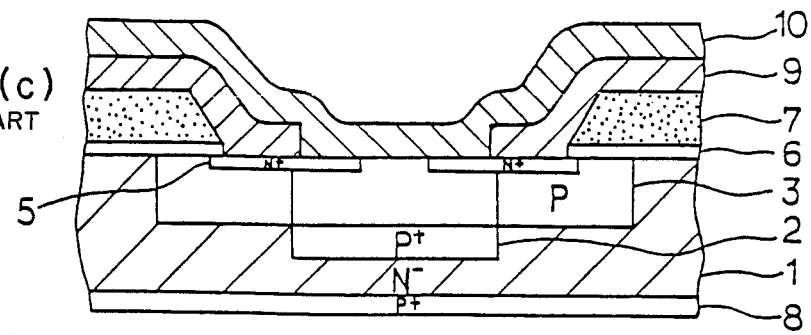

In this embodiment, the process for producing an IGBT will be mainly described. This process is shown in the sectional views of an element in FIGS. 1 and 2, wherein the same numerals are provided for the elements which are the same as those shown in FIGS. 3 and 4.

Figure 1A:
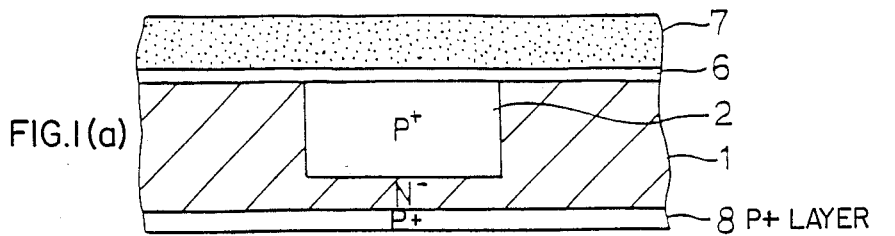
Figure 1B:
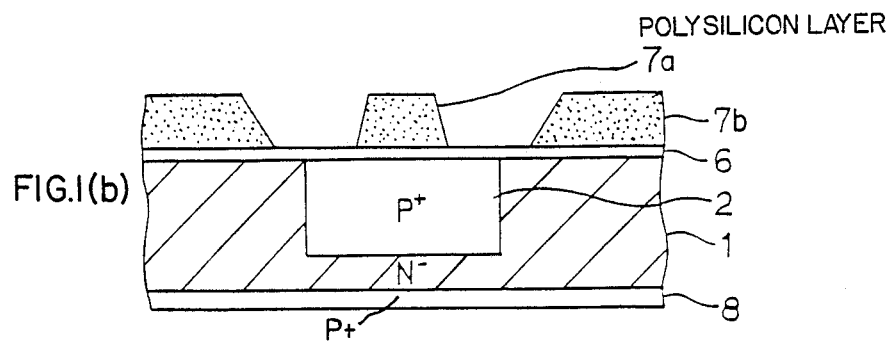
Figure 1C:
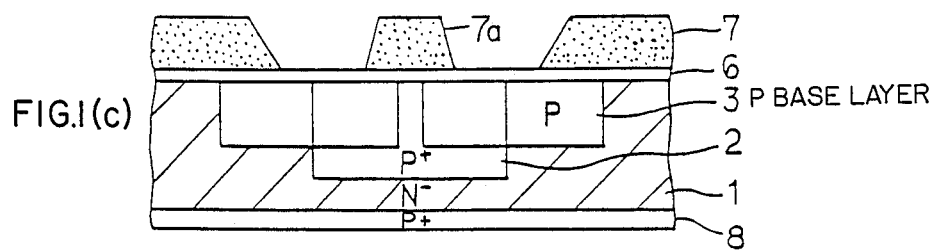
Figure 1D:
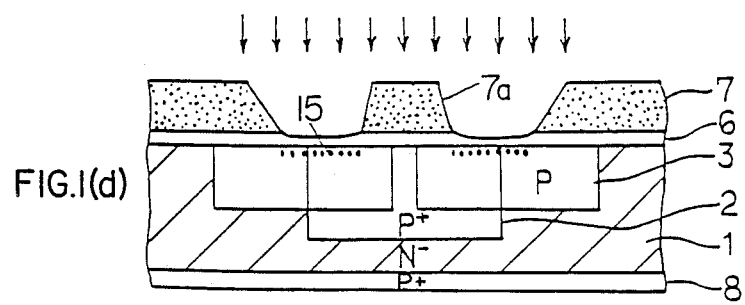
Figure 3:
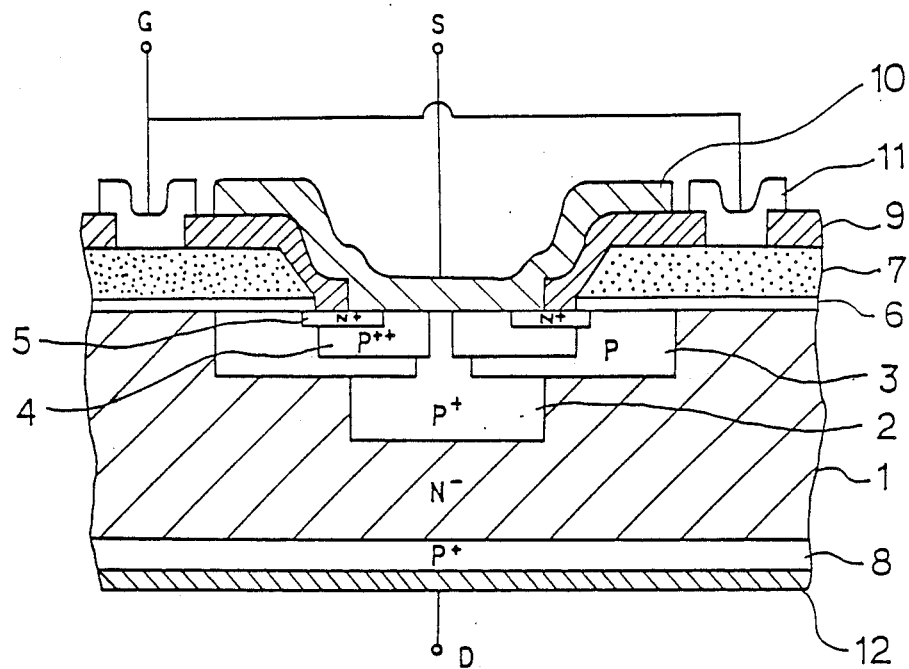
FIG. 3 is a sectional view of the structure of a complete IGBT.

In the same way as in the conventional method, a semiconductor substrate consisting of the N− layer 1 with the P+ layer 8 on the back side thereof and the P+ well 2 embedded in the opposite surface thereof is used. In the present invention, the gate oxide film 6 and the polysilicon layer 7 which is to serve as a gate are subsequently deposited on the semiconductor substrate, as shown in FIG. 1(a). The polysilicon layer 7 is then etched by photolithography. At this time, unlike the conventional method, a central part 7a of the polysilicon layer 7 is left as well as peripheral portions 7b the polysilicon layer 7 as shown in FIG. 1(b), forming a photomask. In the conventional method, the central part 7a of the polysilicon layer 7 does not exist and a single P-type base region 3 shown in FIG. 3 is formed by boron ion implantation using just the peripheral portions 7b of the polysilicon layers 7 as a mask followed by high-temperature driving. The present invention, on the other hand may form two base regions as shown in sectional view in FIG. 1(c). Thereafter, in order to form the N+ source region 5, impurities such as arsenic ions are implanted using the polysilicon layers 7b and 7a as a mask in the same way as in FIG. 1(c). This state is shown in FIG. 1(d), wherein ion implantation is indicated with the arrows and the implanted arsenic ions are represented by the numeral 15.

The P++ region 4 prevents latchup phenomenon from being produced in an IGBT as is more fully described in my U.S. patent application Ser. No. 316,462 (our reference no. 27832) which is incorporated herein by reference. To form the P++ region 4, a resist 16 is applied to the polysilicon layer 7b extending over a portion of the window. Boron ions are implanted using the resist 16 and the central part 7a of the polysilicon layer 7 as a mask. This state is shown in FIG. 2(e) and the ion implantation is indicated with the arrows and the implanted boron ions are represented by the reference numeral 17 in the same way as in FIG. 1(d). The central part 7a of the polysilicon layer 7 is then removed while leaving the resist 16 in place to guide removal of a central portion of the gate oxide film.

Various methods may be considered for removing the central part 7a of the polysilicon layer 7. For example, one method of removing the central part 7a of the polysilicon layer 7 involves dry etching and then removing the part of the gate oxide film 6 which remains at the position under the central part 7a of the polysilicon layer 7. Another method involves dipping the entire part in a hydrofluoric acid etchant, thereby removing the underlayer of the gate oxide film 6 and making the central part 7a of the polysilicon layer 7 float. After removal of the central part 7a of the polysilicon layer 7 and the central portion of the gate oxide film, the resist 16 is removed. This state is shown in FIG. 2(f). A PSG film covering the surface is next formed, photoetched to form a window portion and then subjected to heat treatment to form the PSG insulation layer 9. The heat treatment diffuses the implanted arsenic 15 and boron 17, thereby simultaneously forming the N+ source layer 5 and the P++ layer 4, as shown in FIG. 2(g).

The process of producing an IGBT is described in the above embodiment. In the case of producing a power MOSFET, since it is unnecessary to form the P++ layer for preventing latchup, the N+ source region 5 may be formed by high-temperature treatment after the completion of the step shown in FIG. 1(d).

As described above, according to the present invention, since it is possible to form an N+ source region by self alignment without using any special photomask, the number of manufacturing steps is reduced and, in addition, the positional accuracy of the formation of the various semiconductor regions is improved.

I claim:

1. A method for forming an electrical device comprising the steps of:
    (a) sequentially forming a semiconductor layer of a first conductivity type, a semiconductor well region of a second conductivity type, different from said first conductivity type embedded within and forming a part of a first surface of said semiconductor layer, a gate oxide layer disposed on said first surface, and a polycrystalline semiconductor layer;
    (b) selectively etching said polycrystalline semiconductor layer so as to leave a central part and peripheral portions thereof intact and to form a window region between said central part and said peripheral portions, said window extending over portions of the semiconductor layer of the first conductivity type and the semiconductor well region;

(c) introducing impurities through the window region and treating at high temperature to diffuse the impurities such that the base region of the second conductivity type is formed within the portions of the semiconductor layer of the first conductivity type and the semiconductor well region which are aligned with the window;

(d) introducing further impurities through the window region suitable for forming a region of the first conductivity type;

(e) forming a resist mask over the peripheral portions of the polycrystalline semiconductor layer which extend to cover a portion of the window, such that a second smaller window is formed between the control part of the polycrystalline semiconductor layer and the resist mask;

(f) introducing impurities through the second smaller window suitable for a high impurity density region of the second conductivity type;

(g) removing the resist mask, the central part of the polysilicon layer and a central portion of the gate oxide layer; and (h) thermally diffusing the impurities introduced in steps (d) and (f) to form a source region and a high impurity density region.

2. A method according to claim 1, wherein said insulating layer is a low temperature oxidation film.

3. A method according to claim 1, wherein the device is a vertical insulated gate field effect transistor.

4. A method according to claim 1, wherein the device is a power metal-oxide semiconductor field effect transistor.

5. A method according to claim 1 further comprising the step of forming an insulated layer over the transistor element after removing the resist mask and the exposed portions of the gate oxide film.

6. A method according to claim 5, further comprising the step of forming source, gate and drain electrodes.

7. A method according to claim 5, wherein the insulating layer is applied before thermally diffusing the impurities introduced in steps (d) and (f), and wherein heat is applied to simultaneously reflow the insulating layer and diffuse the impurities.

8. A method according to claim 1, comprising the additional step of forming a semiconductor layer of the second conductivity type of a substrate, wherein the semiconductor layer of the first conductivity type is formed upon the semiconductor layer of the second conductivity type.

* * * * *